(12) United States Patent
Lee

(10) Patent No.: US 12,191,290 B2
(45) Date of Patent: Jan. 7, 2025

(54) SEMICONDUCTOR PACKAGE WITH RECESSED MOLDING REGION DISPOSED BELOW HOUSING AND ABOVE SEMICONDUCTOR CHIP

(71) Applicant: SAMSUNG ELECTRONICS CO., LTD., Suwon-si (KR)

(72) Inventor: In-Jae Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 348 days.

(21) Appl. No.: 17/671,742

(22) Filed: Feb. 15, 2022

(65) Prior Publication Data

US 2022/0392880 A1 Dec. 8, 2022

(30) Foreign Application Priority Data

Jun. 3, 2021 (KR) .................. 10-2021-0072062

(51) Int. Cl.
| H01L 23/48 | (2006.01) |
| H01L 21/56 | (2006.01) |
| H01L 23/31 | (2006.01) |
| H01L 25/16 | (2023.01) |
| H01R 13/66 | (2006.01) |

(Continued)

(52) U.S. Cl.
CPC .......... *H01L 25/165* (2013.01); *H01L 21/561* (2013.01); *H01L 21/565* (2013.01); *H01L 23/3121* (2013.01); *H01R 13/665* (2013.01); *H01L 23/24* (2013.01); *H01L 23/49811* (2013.01); *H01L 24/32* (2013.01); *H01L 24/33* (2013.01); *H01L 24/48* (2013.01); *H01L 24/73* (2013.01); *H01L 2224/32145* (2013.01); *H01L 2224/32225* (2013.01); *H01L 2224/33181* (2013.01); *H01L 2224/48145* (2013.01); *H01L 2224/48227* (2013.01); *H01L 2224/73215* (2013.01); *H01L 2224/73265* (2013.01); *H01R 24/62* (2013.01)

(58) Field of Classification Search
CPC . H01L 21/561; H01L 21/565; H01L 23/3121; H01L 24/32; H01L 24/33; H01L 2224/33181
USPC .......................................................... 257/690
See application file for complete search history.

(56) References Cited

U.S. PATENT DOCUMENTS

| 6,340,792 B1 | 1/2002 | Hirokawa |
| 7,679,184 B2 | 3/2010 | Kusano et al. |

(Continued)

FOREIGN PATENT DOCUMENTS

JP  5495176 B2  5/2014

*Primary Examiner* — Kimberly N Rizkallah
*Assistant Examiner* — Dilinh P Nguyen
(74) *Attorney, Agent, or Firm* — Muir Patent Law, PLLC

(57) ABSTRACT

A semiconductor package includes a package substrate, a semiconductor chip on the package substrate, the semiconductor chip including a logic chip and a memory stack structure on the logic chip, a connector and a connector terminal below the package substrate, a molding layer that covers the semiconductor chip, the molding layer having a recess region on a top surface of the molding layer, a housing that covers the molding layer, and an air gap on the semiconductor chip, the air gap being defined by the housing and the recess region of the molding layer, and the molding layer separating the air gap from the memory stack structure of the semiconductor chip.

20 Claims, 12 Drawing Sheets

(51) Int. Cl.
    *H01L 23/00*     (2006.01)
    *H01L 23/24*     (2006.01)
    *H01L 23/498*     (2006.01)
    *H01R 24/62*     (2011.01)

(56) References Cited

U.S. PATENT DOCUMENTS

| | | |
|---|---|---|
| 8,716,830 B2 | 5/2014 | Poddar et al. |
| 8,753,926 B2 | 6/2014 | Healy et al. |
| 9,349,613 B1 | 5/2016 | Baloglu et al. |
| 9,449,903 B2 | 9/2016 | Mclellan et al. |
| 9,748,160 B2 * | 8/2017 | Kim .................. H01L 24/96 |
| 2004/0032021 A1 | 2/2004 | Shieh et al. |
| 2007/0278667 A1 * | 12/2007 | Kusano .................. H01L 21/565 |
| | | 257/E23.088 |
| 2019/0122950 A1 * | 4/2019 | Groothuis ........... H01L 23/3675 |
| 2019/0333907 A1 * | 10/2019 | Lee .................. H01L 24/32 |

\* cited by examiner

SEMICONDUCTOR PACKAGE WITH RECESSED MOLDING REGION DISPOSED BELOW HOUSING AND ABOVE SEMICONDUCTOR CHIP

CROSS-REFERENCE TO RELATED APPLICATION

This U.S. nonprovisional application claims priority under 35 U.S.C § 119 to Korean Patent Application No. 10-2021-0072062 filed on Jun. 3, 2021, in the Korean Intellectual Property Office, the disclosure of which is hereby incorporated by reference in its entirety.

BACKGROUND

1. Field

Embodiments relate to a semiconductor package, and more particularly, to a semiconductor package in which an air gap is provided between a molding layer and a housing.

2. Description of the Related Art

In the semiconductor industry, high capacity, thinness, and small size of semiconductor devices and electronic products using the same have been demanded, and thus, various package techniques have been suggested. A semiconductor package is provided to implement an integrated circuit chip to qualify for use in electronic products. A semiconductor package is typically configured such that a semiconductor chip is mounted on a printed circuit board (PCB) and bonding wires or bumps are used to electrically connect the semiconductor chip to the printed circuit board. With the development of electronic industry, electronic products have increasing demands for high performance, high speed, and compact size.

SUMMARY

According to example embodiments, a semiconductor package may include a package substrate, a semiconductor chip on the package substrate, a connector and a connector terminal below the package substrate, a molding layer that covers the semiconductor chip and has a recess region on a top surface of the molding layer, a housing that covers the molding layer, and an air gap on the semiconductor chip, the air gap being defined by the housing and the recess region of the molding layer. The semiconductor chip may include a logic chip and a memory stack structure on the logic chip. The molding layer may separate the memory stack structure from the air gap.

According to other example embodiments, a semiconductor package may include a package substrate, a semiconductor chip on the package substrate, a connector below the package substrate, a molding layer that covers the semiconductor chip and has a recess region on a top surface of the molding layer, a housing that covers the molding layer, the housing including a first part on the top surface of the molding layer, a second part below the package substrate, and a third part that connects the first part and the second part to each other, and an air gap defined by the first part of the housing and the recess region of the molding layer. The semiconductor chip may include a logic chip and a memory stack structure on the logic chip. The air gap may vertically overlap the semiconductor chip.

According to yet other example embodiments, a semiconductor package may include a package substrate, a semiconductor chip on the package substrate, the semiconductor chip including a logic chip and a memory stack structure on the logic chip, a passive element on the package substrate and spaced apart from the semiconductor chip, a connector and a connector terminal below the package substrate, a molding layer that covers the semiconductor chip and the passive element, the molding layer having a recess region on a top surface of the molding layer, a housing that covers the molding layer, the housing including a first part on the top surface of the molding layer, a second part below the package substrate, and a third part that connects the first part and the second part to each other, an opening defined by a bottom surface of the package substrate, the second part, and the third part, and an air gap defined by the first part of the housing and the recess region of the molding layer. The molding layer may separate the memory stack structure from the air gap.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
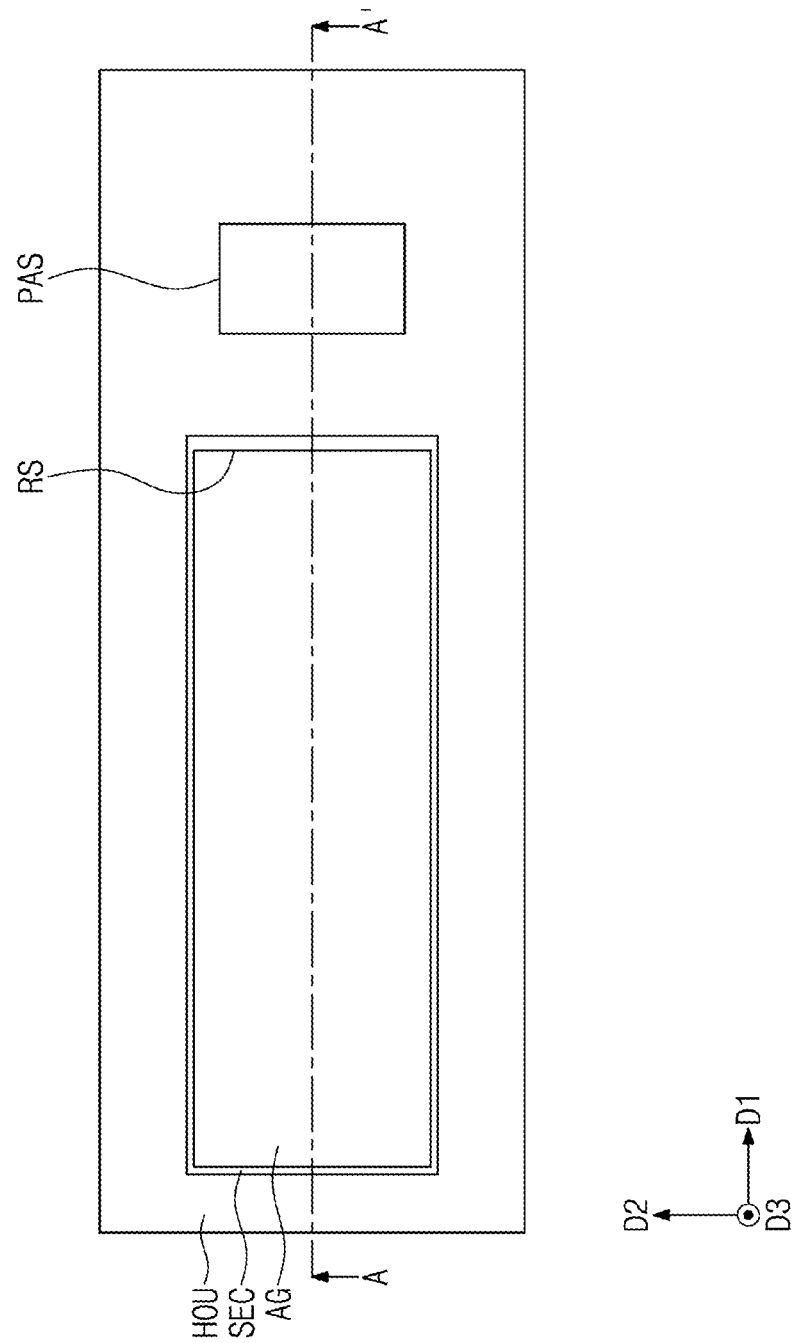
FIG. 1 illustrates a plan view showing a semiconductor package according to some embodiments.
Figure 2:
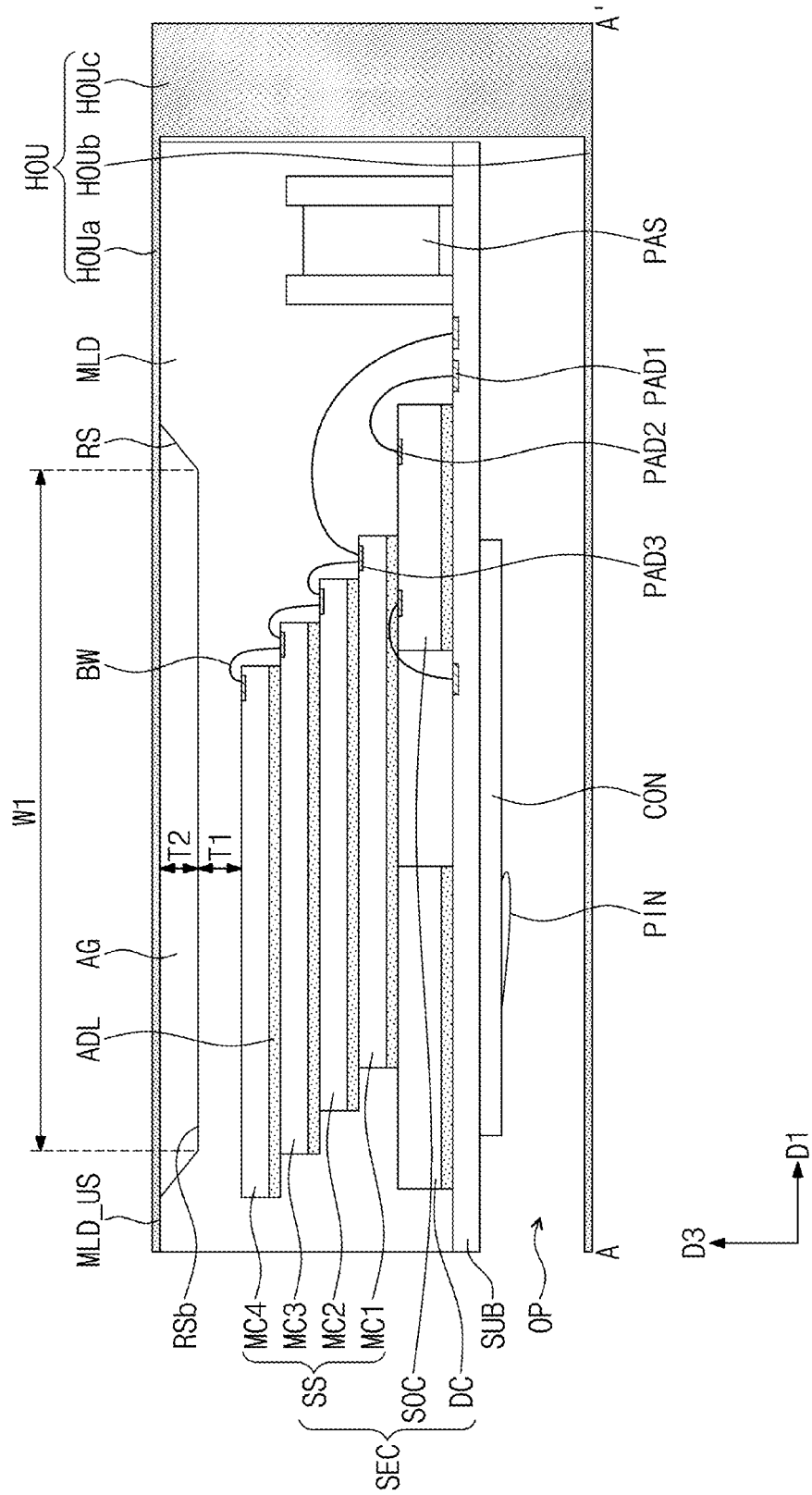
FIGS. 2 to 4 illustrate cross-sectional views taken along line A-A' of FIG. 1.

FIG. 1 illustrates a plan view showing a semiconductor package according to some embodiments. FIG. 2 illustrates a cross-sectional view along line A-A' of FIG. 1.

Referring to FIGS. 1 and 2, a semiconductor package according to some embodiments may include a package substrate SUB. For example, the package substrate SUB may be a printed circuit board (PCB). First pads PAD1 may be disposed adjacent to a top surface of the package substrate SUB. Each of the first pads PAD1 may include a conductive metallic material. For example, the first pad PAD1 may include copper (Cu). The first pad PAD1 may have a top surface exposed by the package substrate SUB, e.g., top surfaces of the first pad PAD1 and the package substrate SUB may be coplanar. The package substrate SUB may include therein routing lines and one or more vias.

A semiconductor chip SEC may be mounted on the package substrate SUB. For example, the semiconductor chip SEC may include a logic chip SOC, a dummy chip DC, and a memory stack structure SS.

The logic chip SOC may be mounted on the package substrate SUB. The logic chip SOC may drive the memory stack structure SS which will be discussed below. The logic chip SOC may be called a controller chip that controls the memory stack structure SS. The logic chip SOC may include a central processing unit and a memory controller. The logic chip SOC may include therein transistors and a wiring layer on the transistors. The transistors may constitute a logic circuit.

The logic chip SOC may include second pads PAD2 therein. Each of the second pads PAD2 may include a conductive metallic material. For example, the second pad PAD2 may include copper (Cu). The second pad PAD2 may be disposed adjacent to a top surface of the logic chip SOC. The second pad PAD2 may have a top surface exposed by the logic chip SOC, e.g., top surfaces of the second pad PAD2 and the logic chip SOC may be coplanar.

The memory stack structure SS may be mounted on the logic chip SOC. The memory stack structure SS may include first to fourth memory dies MC1 to MC4 that are sequentially stacked. For example, the first to fourth memory dies MC1 to MC4 may be NAND Flash Memories. The logic chip SOC may drive each of the first to fourth memory dies MC1 to MC4. For example, the first to fourth memory dies MC1 to MC4 may have their chip sizes that are substantially the same as each other. In this case, the first to fourth memory dies MC1 to MC4 may have substantially the same planar shape and planar size.

Each of the first to fourth memory dies MC1 to MC4 may include therein memory transistors and a wiring layer on the memory transistors. Each of the first to fourth memory dies MC1 to MC4 may be provided thereon with a third pad PAD3 adjacent to a top surface thereof. The third pad PAD3 may have a top surface exposed on the top surface of a corresponding one of the first to fourth memory dies MC1 to MC4 e.g., top surfaces of each of the third pad PAD3 and a corresponding one of the first to fourth memory dies MC1 to MC4 may be coplanar. Each of the first to fourth memory dies MC1 to MC4 may have a portion horizontally offset from a memory die that is adjacent thereto.

The semiconductor chip SEC may further include the dummy chip DC. The dummy chip DC may be mounted on the package substrate SUB. The dummy chip DC may be spaced apart in a first direction D1 from the logic chip SOC. The dummy chip DC may have a top surface located at substantially the same level as that of the top surface of the logic chip SOC. For example, the dummy chip DC may have a bottom surface in contact with the top surface of the package substrate SUB. The dummy chip DC may have no electrical function, e.g., the dummy chip DC may not be electrically connected to any elements. The memory stack structure SS may be disposed on the dummy chip DC, e.g., opposite ends of the memory stack structure SS may be disposed on respective portions of the dummy chip DC and the logic chip SOC (FIG. 2). The dummy chip DC may support the memory stack structure SS. For example, the dummy chip DC may include a silicon substrate.

Adhesion layers ADL may cause attachment between the logic chip SOC, the memory stack structure SS, and the dummy chip DC. For example, the adhesion layers ADL may be interposed between the first memory die MC1 and each of the logic chip SOC and the dummy chip DC, between the first memory die MC1 and the second memory die MC2, between the second memory die MC2 and the third memory die MC3, and between the third memory die MC3 and the fourth memory die MC4. The adhesion layers ADL may include a dielectric polymer, e.g., an epoxy-based polymer. The adhesion layer ADL may further be interposed between the dummy chip DC and the package substrate SUB and between the logic chip SOC and the package substrate SUB.

A plurality of bonding wires BW may electrically connect to each other the memory stack structure SS, the package substrate SUB, and the logic chip SOC. The bonding wires BW may electrically connect to each other the first to fourth memory dies MC1 to MC4 of the memory stack structure SS. The bonding wires BW may connect to each other the third pads PAD3 of the first to fourth memory dies MC1 to MC4.

The bonding wire BW may connect the third pad PAD3 of the first memory die MC1 to one of the first pads PAD1 of the package substrate SUB. For example, the bonding wire BW may electrically connect to each other the package substrate SUB and the memory stack structure SS.

The bonding wire BW may electrically connect to each other the logic chip SOC and the package substrate SUB. For example, the bonding wire BW may connect one of the second pads PAD2 included in the logic chip SOC to one of the first pads PAD1 included in the package substrate SUB. For example, one of the bonding wires BW may connect one of the second pads PAD2 included in the logic chip SOC through the adhesion layer ADL interposed between the first memory die MC1 and the logic chip SOC to one of the first pads PAD1 included in the package substrate SUB. The logic chip SOC and the memory stack structure SS may be electrically connected to each other through the routing lines and the one or more vias in the package substrate SUB.

Alternatively, connection terminals (e.g., micro-bumps) may be provided between the logic chip SOC and the package substrate SUB. In this case, the bonding wires BW that connect the logic chip SOC and the package substrate SUB to each other may be omitted.

In yet another alternative, the adhesion layers ADL may be omitted, and the first to third memory dies MC1 to MC3 may include through vias (TSV) that penetrate therethrough. Micro-bumps may be provided between the logic chip SOC and the first memory die MC1, between the first memory die MC1 and the second memory die MC2, between the second memory die MC2 and the third memory die MC3, and between the third memory die MC3 and the fourth memory die MC4. For example, through vias may be used to electrically connect the first to fourth memory dies MC1 to MC4 to each other.

A passive element PAS may be mounted on the package substrate SUB. The passive element PAS may be spaced apart in the first direction D1 from the semiconductor chip SEC. The passive element PAS may include at least one of a resistor, a capacitor, and an inductor.

A molding layer MLD may be provided to cover the semiconductor chip SEC and the passive element PAS. The molding layer MLD may completely cover the semiconductor chip SEC and the passive element PAS, e.g., the molding layer MLD may not even partially expose any parts of the semiconductor chip SEC and the passive element PAS. The molding layer MLD may include a dielectric polymer, e.g., an epoxy-based polymer.

The molding layer MLD may include a recess region RS on a top surface MLD_US thereof. For example, as illustrated in FIG. 2, the top surface MLD_US may be a topmost surface of the molding layer MLD that faces away from the semiconductor chip SEC, and the recess region RS may be recessed to a predetermined depth into the molding layer MLD from the top surface MLD_US thereof. That is, the recess region RS may be an area that is concave in a direction toward the semiconductor chip SEC from the top surface MLD_US of the molding layer MLD. The recess region RS may be provided on the semiconductor chip SEC, e.g., the recess region RS may overlap a top surface of the semiconductor chip SEC.

According to some embodiments, the semiconductor package SEC may be a universal serial bus (USB) memory device. A housing HOU may be provided to cover the molding layer MLD. The housing HOU may include a metallic material or a plastic material. The housing HOU may serve to protect internal components of the USB memory device.

The housing HOU may include a first part HOUa provided on the top surface MLD_US of the molding layer MLD, a second part HOUb provided below the package substrate SUB, and a third part HOUc that connects the first and second parts HOUa and HOUb to each other.

The first part HOUa may be spaced apart from a bottom surface RSb and an inner sidewall of the recess region RS, while covering the top surface MLD_US of the molding layer MLD, e.g., the first part HOUa may be in direct contact with the entirety of the top surface MLD_US of the molding layer MLD. Therefore, as discussed below, an air gap AG may be defined to indicate an empty space between the bottom surface RSb of the recess region RS and the first part HOUa. For example, the air gap AG may completely fill the recess region RS.

The second part HOUb may be disposed below the package substrate SUB, e.g., so the package substrate SUB may be between the first part HOUa and the second part HOUb in a third direction D3. The second part HOUb may be spaced apart from a bottom surface of the package substrate SUB, e.g., along the third direction D3. The second part HOUb may be spaced apart, e.g., along the third direction D3, from a connector CON and a connector terminal PIN, both of which may be on the bottom surface of the package substrate SUB, as will be discussed below. For example, the package substrate SUB and the second part HOUb may be provided therebetween with an empty space, i.e., an opening OP, into which an external electronic device can be inserted.

The third part HOUc may connect the first part HOUa and the second part HOUb to each other. The third part HOUc may be a portion of the housing HOU that extends in the third direction D3. The third part HOUc may have a thickness, e.g., in the third direction D1, that is greater a thickness, e.g., in the third direction D3, of each of the first and second parts HOUa and HOUb.

The connector CON may be provided on the bottom surface of the package substrate SUB. The connector CON may be electrically connected to the package substrate SUB and the semiconductor chip SEC. The connector terminal PIN may be provided on a bottom surface of the connector CON. The connector terminal PIN may serve to connect to each other an external electronic device and the USB memory device. For example, the connector terminal PIN may electrically connect to each other an external electronic device and the semiconductor chip SEC.

An opening OP may be defined by a bottom surface of the package substrate SUB, a top surface of the second part HOUb included in the housing HOU, and an inner sidewall of the third part HOUc included in the housing HOU. The opening OP may be an empty space into which an external electronic device can be inserted. For example, an external electronic device may be inserted into the opening OP, and may thus be electrically connected to the connector terminal PIN and the connector CON. Therefore, the semiconductor chip SEC of the USB memory device may be electrically connected to the external electronic device.

The air gap AG may be provided on, e.g., above a top surface of, the semiconductor chip SEC. For example, the air gap AG may have a planar area less than that of the semiconductor chip SEC, e.g., so the air gap AG may overlap only a part of the top surface of the semiconductor chip SEC. The air gap AG may be defined by the first part HOUa of the housing HOU and the recess region RS of the molding layer MLD, e.g., the air gap AG may be an empty space extending from, e.g., and directly contacting, the first part HOUa of the housing HOU to, e.g., and directly contacting, the bottom surface RSb of the recess region RS of the molding layer MLD. The air gap AG may be an empty space defined, e.g., formed, between the molding layer MLD and the housing HOU. The air gap AG may vertically overlap the semiconductor chip SEC. For example, the air gap AG may be horizontally offset from the passive element PAS, e.g., facing sidewalls of the air gap AG and the passive element PAS may be spaced apart from each other along the first direction D1. In another example, the air gap AG may extend in the first direction D1, and a portion of the air gap AG may vertically overlap a top of the passive element PAS.

The air gap AG may have a width that gradually increases in a direction perpendicular to the top surface of the package substrate SUB. For example, the width of the air gap AG in the first direction D1 may progressively increase along the third direction D3, e.g., the width of the air gap AG in the first direction D1 may progressively increase as a distance from the bottom surface RSb of the recess region RS increases in the third direction D3. The bottom surface RSb of the recess region RS may be parallel to the top surface of the package substrate SUB. The inner sidewall of the recess region RS may be inclined. For example, the inner sidewall of the recess region RS and a sidewall of the molding layer MLD may be brought nearer to each other in the third direction D3.

The air gap AG may be spaced apart from the semiconductor chip SEC. For example, the air gap AG may be spaced apart in the third direction D3 from the fourth memory die MC4 of the memory stack structure SS. A portion of the molding layer MLD may be interposed between the air gap AG and the fourth memory die MC4. A first thickness T1 may be given as a thickness of the molding layer MLD, e.g., in the third direction D3, interposed between the semiconductor chip SEC and the bottom surface RSb of the recess region RS. For example, the first thickness T1 may be given as a thickness of the molding layer MLD interposed between the fourth memory die MC4 and the bottom surface RSb of the recess region RS. The first thickness T1 may correspond to the shortest distance between the memory stack structure SS and the bottom surface RSb of the recess region RS. For example, the first thickness T1 may range from about 0.1 mm to about 1.2 mm. As the molding layer MLD is interposed between the air gap AG and the memory stack structure SS, it may be possible to effectively reduce heat transfer from the semiconductor chip SEC toward the first part HOUa of the housing HOU.

A second thickness T2 may be given as a thickness of the air gap AG, e.g., in the third direction D3. The thickness of the air gap AG may correspond to a distance between the bottom surface RSb of the recess region RS and a bottom surface of the first part HOUa of the housing HOU. For example, the second thickness T2 may range from about 0.2 mm to about 0.6 mm.

A first width W1 may be given as a width in the first direction D1 at, e.g., of, the bottom surface RSb of the recess region RS. The first width W1 may range from about 1.2 mm to about 1.5 mm. The recess region RS may have a width that gradually increases in the third direction D3.

The air gap AG may be an empty space provided between the molding layer MLD and the housing HOU, and air may fill the air gap AG. Air may have a thermal conductivity less than that of a dielectric polymer, e.g., an epoxy-based polymer that may constitute the molding layer MLD. Therefore, heat transfer toward the first part HOUa of the housing HOU from the logic chip SOC and the memory stack structure SS may be more effectively reduced, e.g., as compared to a molding layer directly on a housing without an air gap therebetween. The housing HOU may therefore have a reduced surface temperature. As such, it may be possible to avoid risk of burn on users and to improve product satisfaction.

Figure 3:
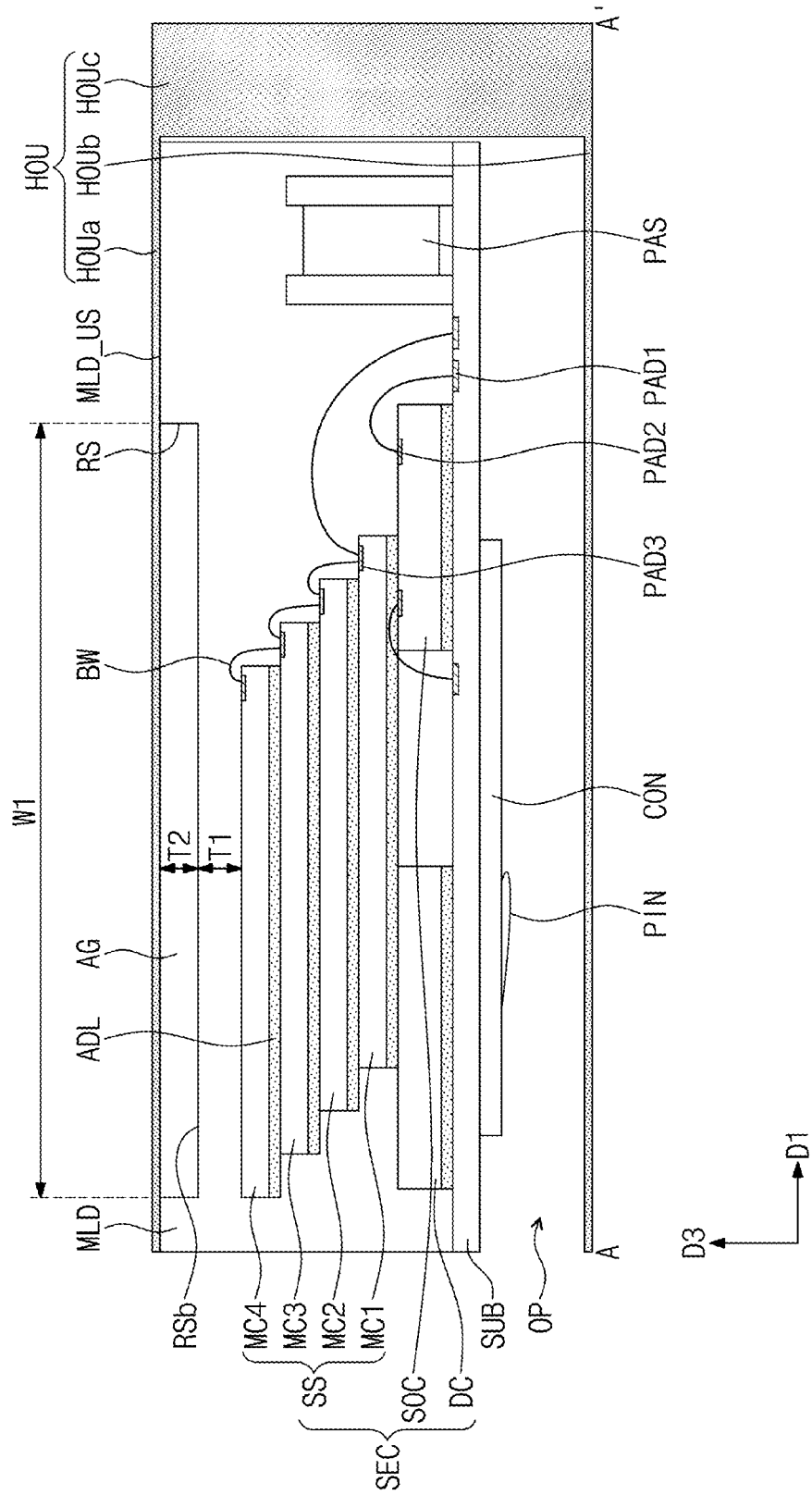

FIG. 3 illustrates a cross-sectional view taken along line A-A' of FIG. 1, showing a semiconductor package according to some embodiments. In the embodiment that follows, a duplicate description relative to FIG. 2 is omitted, and only differences relative to FIG. 2 will be described.

Referring to FIG. 3, the inner sidewall of the recess region RS may not be inclined. For example, the inner sidewall of the recess region RS may have a profile that extends vertically. A first width W1 may be given as a width in the first direction D1 at the bottom surface RSb of the recess region RS. The recess region RS may have a width that is constant without being changed along the third direction D3. For example, the air gap AG may have a width that is constant without being changed along the third direction D3.

Figure 4:
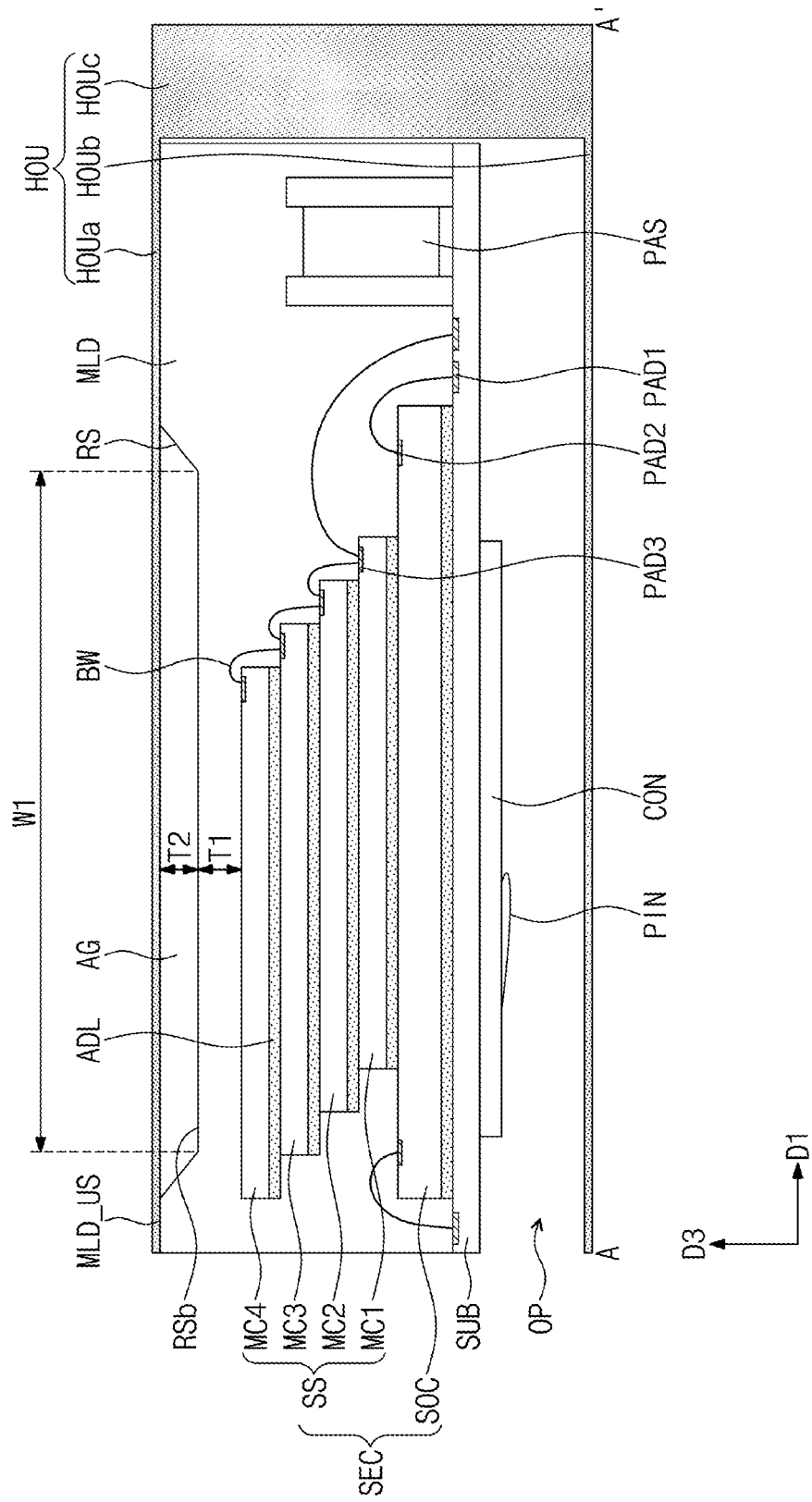

FIG. 4 illustrates a cross-sectional view taken along line A-A' of FIG. 1, showing a semiconductor package according to some embodiments. In the embodiment that follows, a duplicate description relative to FIG. 2 is omitted, and only differences relative to FIG. 2 will be described.

Referring to FIG. 4, the semiconductor chip SEC may not include the dummy chip DC. For example, the semiconductor chip SEC may include a logic chip SOC and a memory stack structure SS provided on the logic chip SOC. The logic chip SOC may extend longitudinally in the first direction D1 so as to support the memory stack structure SS. The memory stack structure SS may vertically overlap the logic chip SOC.

Figure 5:
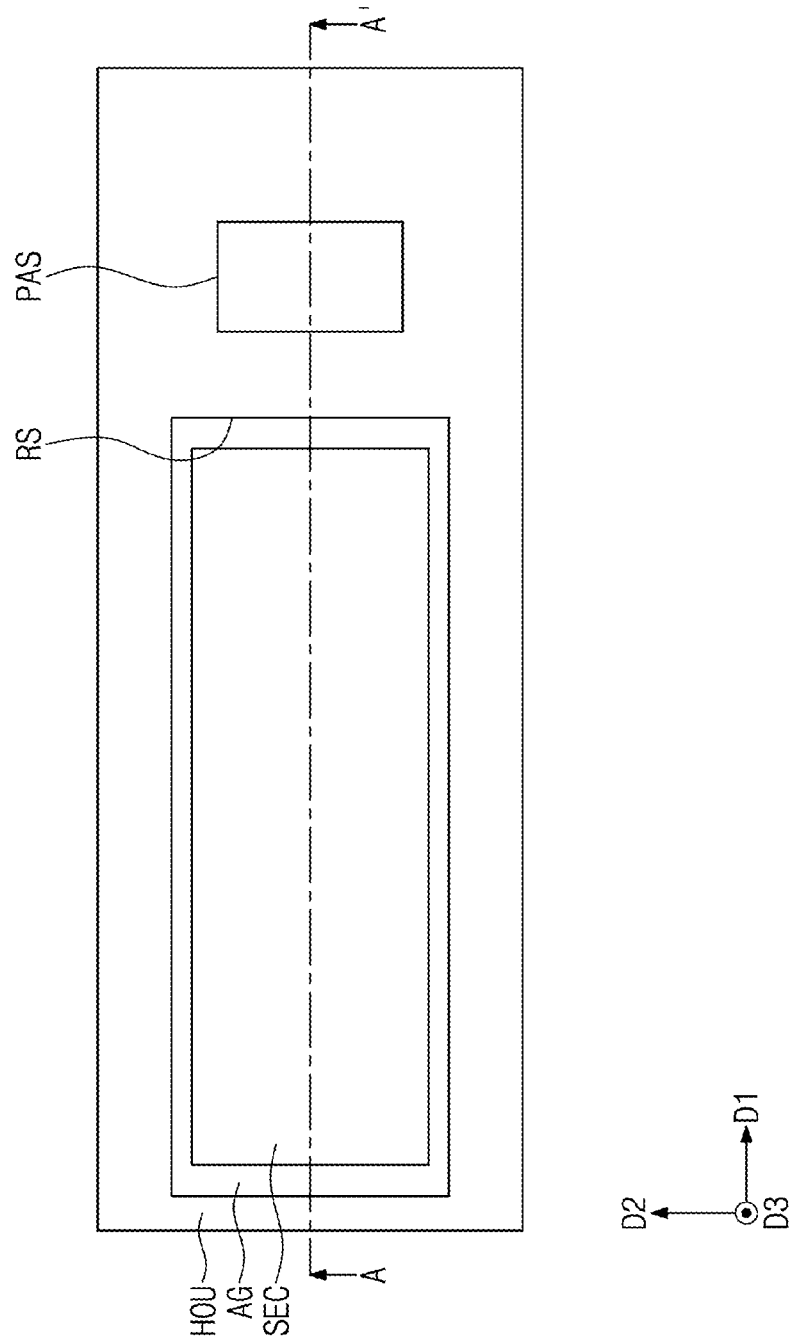
FIG. 5 illustrates a plan view showing a semiconductor package according to some embodiments.
Figure 6:
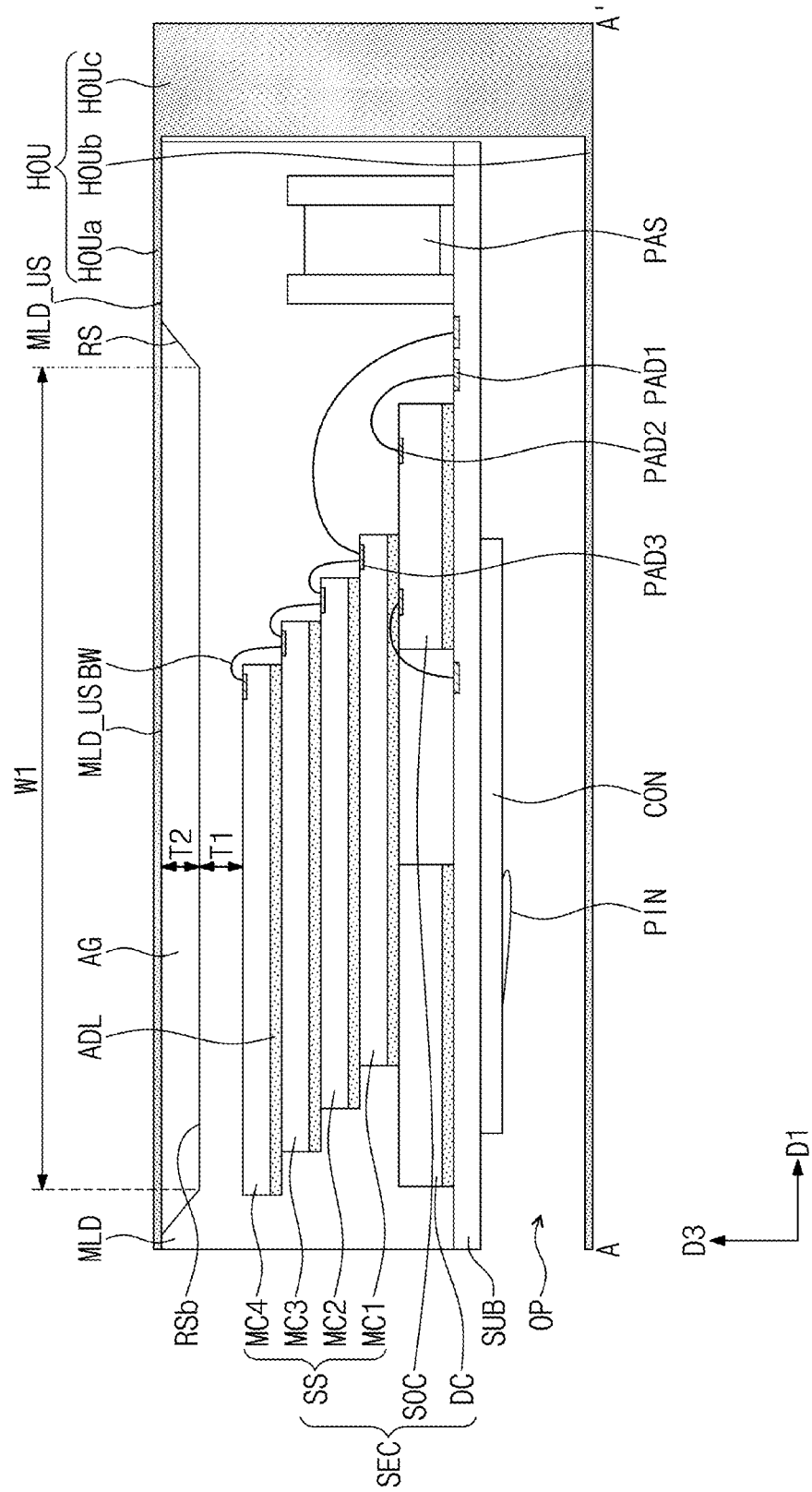
FIG. 6 illustrates a cross-sectional view taken along line A-A' of FIG. 5.

FIG. 5 illustrates a plan view showing a semiconductor package according to some embodiments. FIG. 6 illustrates a cross-sectional view taken along line A-A' of FIG. 5. In the embodiment that follows, a duplicate description relative to FIG. 2 is omitted, and only differences relative to FIG. 2 will be described.

Referring to FIGS. 5 and 6, the semiconductor chip SEC may vertically overlap the air gap AG, e.g., the semiconductor chip SEC may vertically overlap only a portion of the air gap AG. A portion of the air gap AG may be horizontally offset from the semiconductor chip SEC, e.g., the air gap AG may extend horizontally along the first direction D1 beyond the semiconductor chip SEC. The air gap AG may have a planar area greater than that of the semiconductor chip SEC. For example, as illustrated in FIG. 6, the air gap AG may be horizontally offset, e.g., completely spaced apart, from the passive element PAS. In another example, the air gap AG may further extend in the first direction D1 to vertically overlap at least a portion of the top surface of the passive element PAS.

Figure 7:
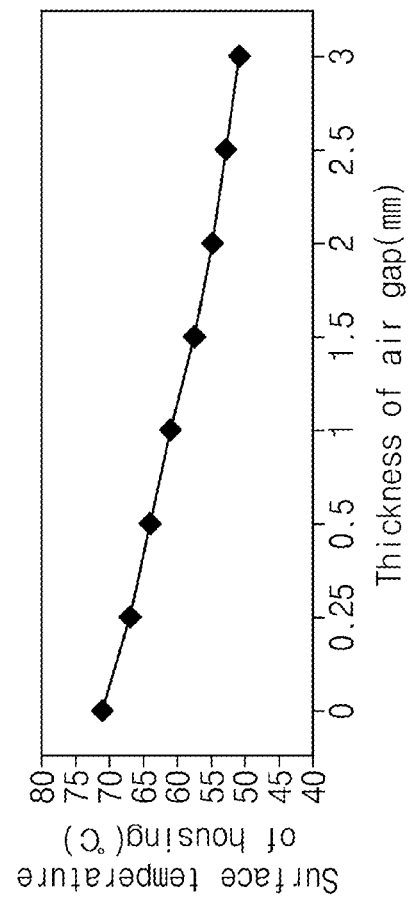
FIG. 7 illustrates a graph showing how surface temperature of a housing is changed according to thickness of an air gap.

FIG. 7 illustrates a graph showing how surface temperature of a housing is changed according to thickness of an air gap. In this description, a thickness of the air gap AG may correspond to the second thickness T2 discussed with reference to FIG. 2, and a surface temperature of the housing HOU may be a top surface temperature of the first part HOUa included in the housing HOU.

Referring to FIG. 7, it may be ascertained that the surface temperature of the housing HOU drops linearly as the thickness of the air gap AG increases. For example, the surface temperature of the housing HOU may be more effectively reduced in a case where the air gap AG is formed on the molding layer MLD than in a case where the air gap AG is not formed. However, a size of the USB memory device may cause difficulty in forming the air gap AG whose thickness is greater than about 0.6 mm, and it may be preferable that the air gap AG be formed to have a size equal to or greater than about 0.2 mm so as to effectively reduce the surface temperature of the housing HOU. The thickness of the air gap AG may be adjusted according to a target surface temperature of the housing HOU and a target size of the USB memory device.

Figure 8A:
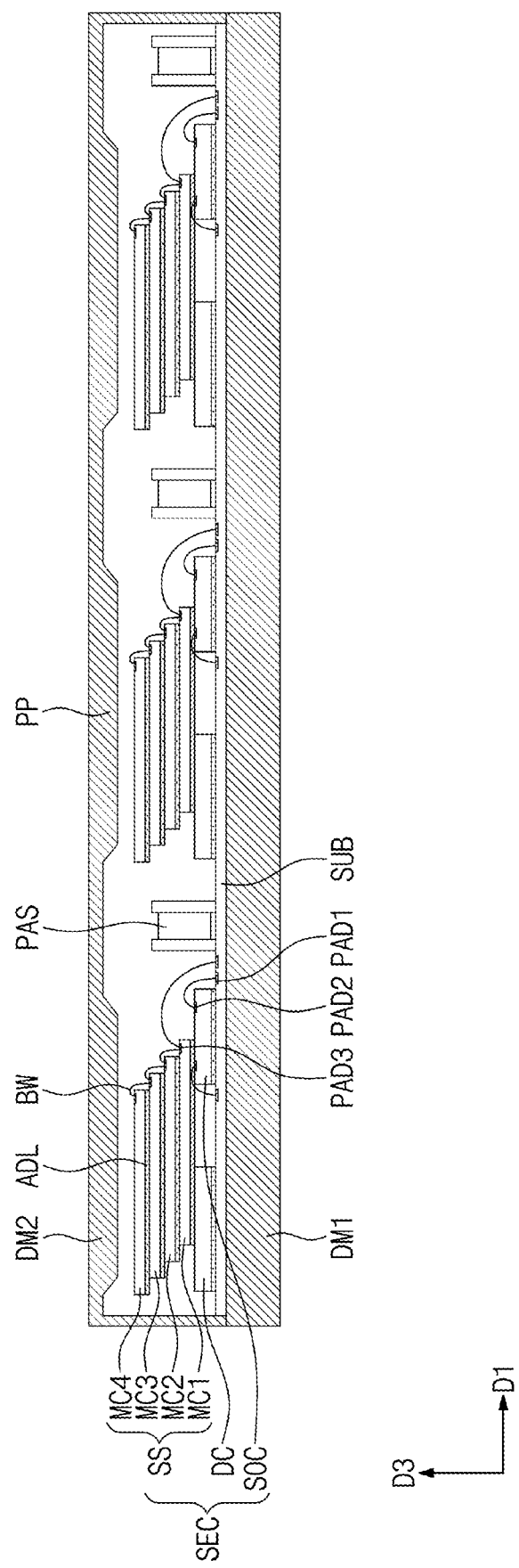
FIGS. 8A to 8C illustrate cross-sectional views showing stages in a method of fabricating a semiconductor package according to some embodiments.
Figure 8B:
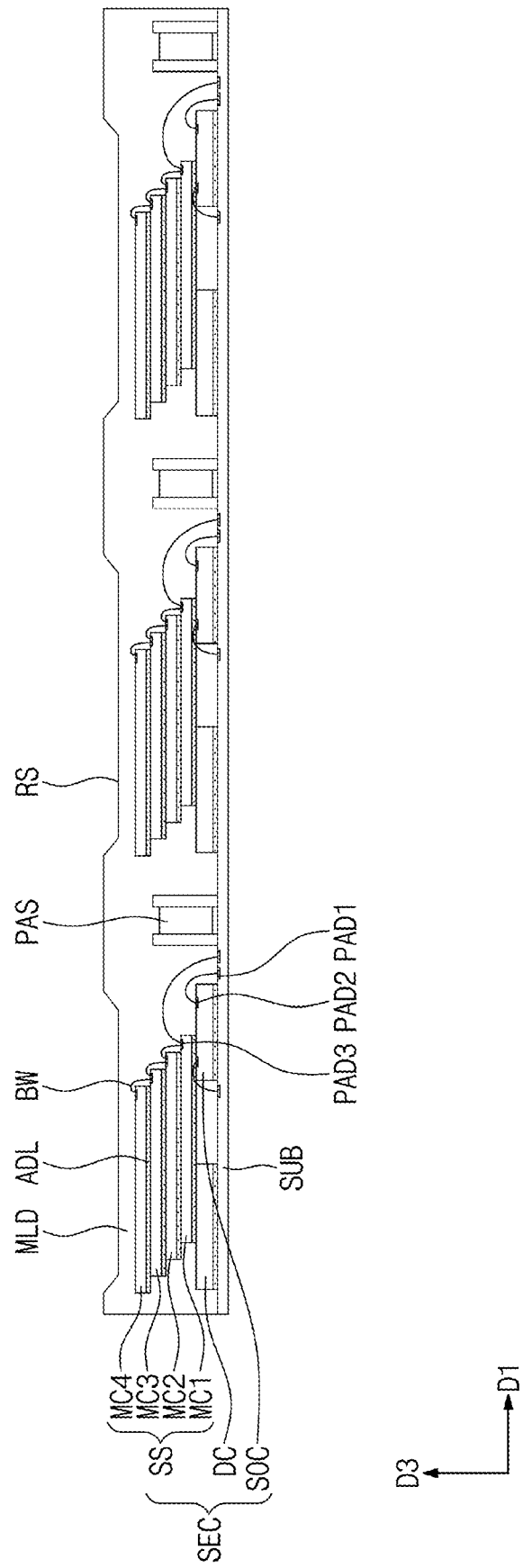
Figure 8C:
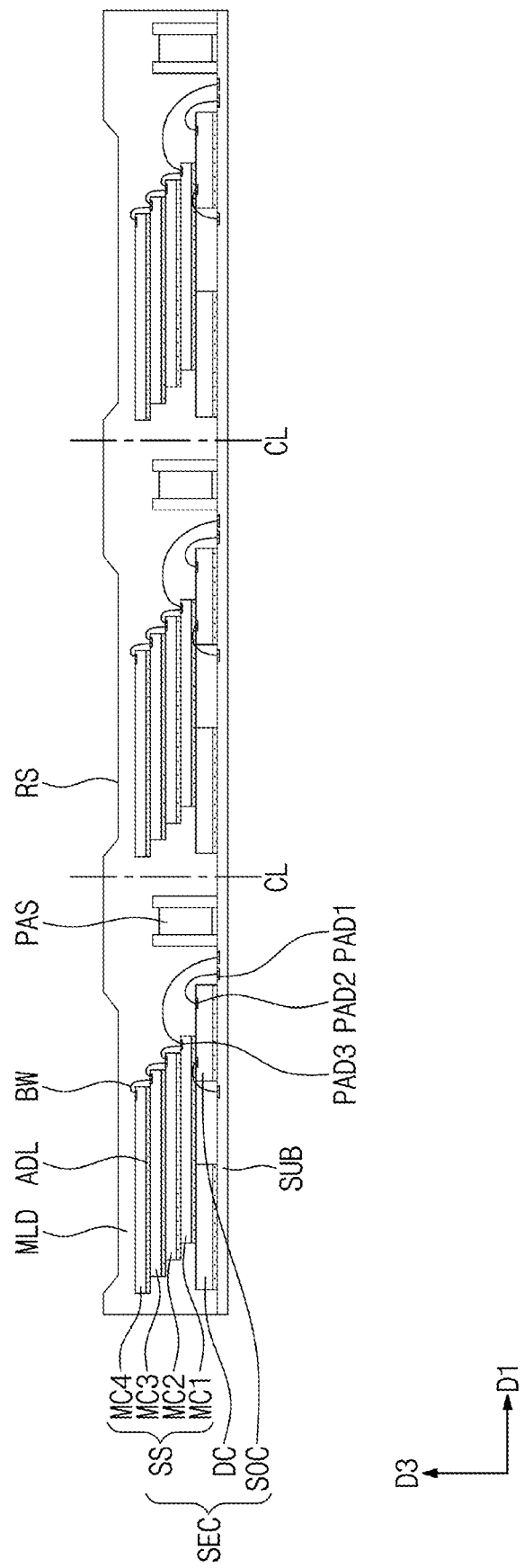

FIGS. 8A to 8C illustrate cross-sectional views showing stages in a method of fabricating a semiconductor package according to some embodiments.

Referring to FIG. 8A, a plurality of semiconductor chips SEC and a plurality of passive elements PAS may be mounted on a package substrate SUB. Each of the semiconductor chips SEC and each of the passive elements PAS may be respectively substantially the semiconductor chip SEC and the passive element PAS that are discussed with reference to FIG. 2.

A first mold DM1 may be disposed on the package substrate SUB. A second mold DM2 may be disposed on the package substrate SUB. The first mold DM1 and the second mold DM2 may surround the package substrate SUB, the semiconductor chips SEC, and the passive elements PAS.

The second mold DM2 may include a protrusion PP with a profile that corresponds to that of the recess region RS discussed with reference to FIG. 2. The protrusion PP may be formed on a location that corresponds to, e.g., overlaps, that of each of the semiconductor chips SEC. For example, the second mold DM2 may be provided with a plurality of protrusions PP.

Referring to FIG. 8B, a molding process may be performed to form the molding layer MLD. The molding layer MLD may include a dielectric polymer, e.g., an epoxy-based polymer. The molding layer MLD may be formed between the second mold DM2, the package substrate SUB, the semiconductor chips SEC, and the passive elements PAS. For example, the dielectric polymer may be filled into a space between the second mold DM2 and each of the package substrate SUB, the semiconductor chips SEC, and the passive elements PAS to form the molding layer MLD. For example, as illustrated in FIG. 8B, the molding layer MLD may have a top surface with a profile that corresponds to that of the second mold DM2. In another example, as illustrated in FIG. 3, the recess region RS may have an inner wall that is not inclined and extends vertically, e.g., when the protrusion PP of the second mold DM2 does not have an inclined wall.

The molding layer MLD may have a recess region RS on the top surface thereof. The recess region RS may be an area that is concave in a direction toward the package substrate SUB from the top surface of the molding layer MLD. The recess region RS may have a profile that corresponds to that of the protrusion PP of the second mold DM2. The recess region RS may be formed on each of the semiconductor chips SEC.

Referring to FIG. 8C, a cutting process may be performed. For example, the molding layer MLD and the package substrate SUB may be diced along cutting lines CL illustrated in FIG. 8C. Therefore, it may be possible to fabricate a plurality of universal serial bus (USB) memory devices.

Referring back to FIG. 2, the connector CON and the connector terminal PIN may be formed below the package substrate SUB that is individually cut. The housing HOU may be formed to cover the molding layer MLD that is individually cut. The housing HOU may include the first part HOUa formed on the top surface of the molding layer MLD, the second part HOUb formed below the package substrate SUB, and the third part HOUc that connects the first and second parts HOUa and HOUc to each other. The air gap AG may be defined by the first part HOUa and the recess region RS.

Figure 9A:
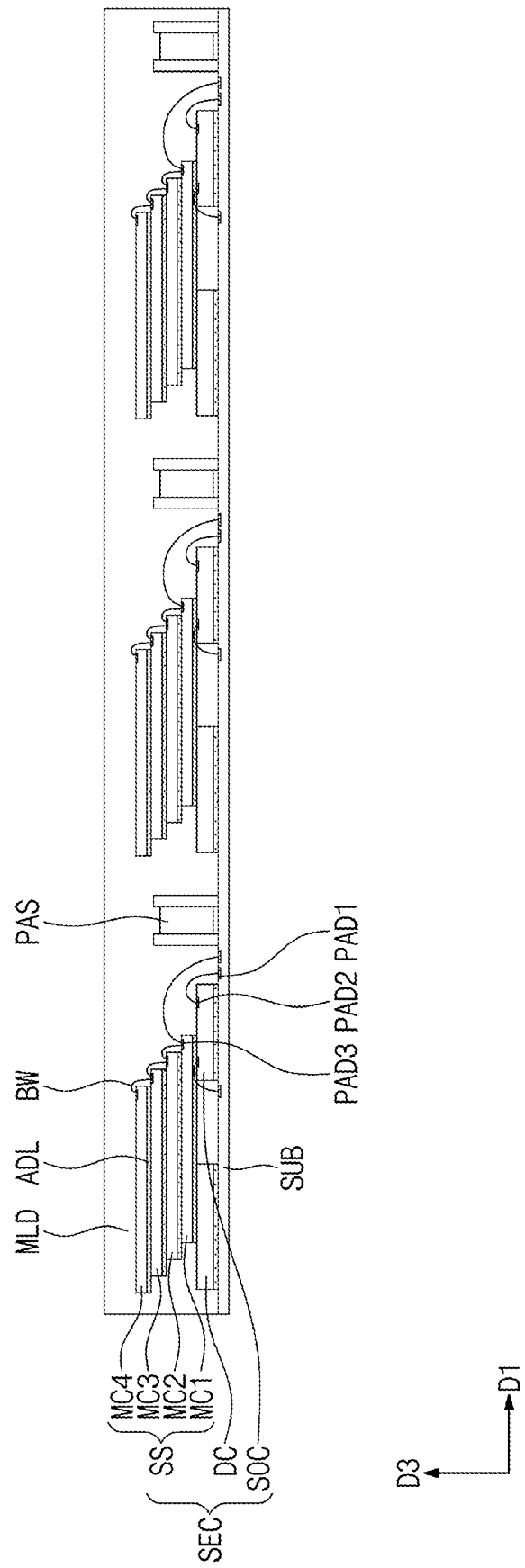
FIGS. 9A and 9B illustrate cross-sectional views showing stages in a method of fabricating a semiconductor package according to some embodiments.
Figure 9B:
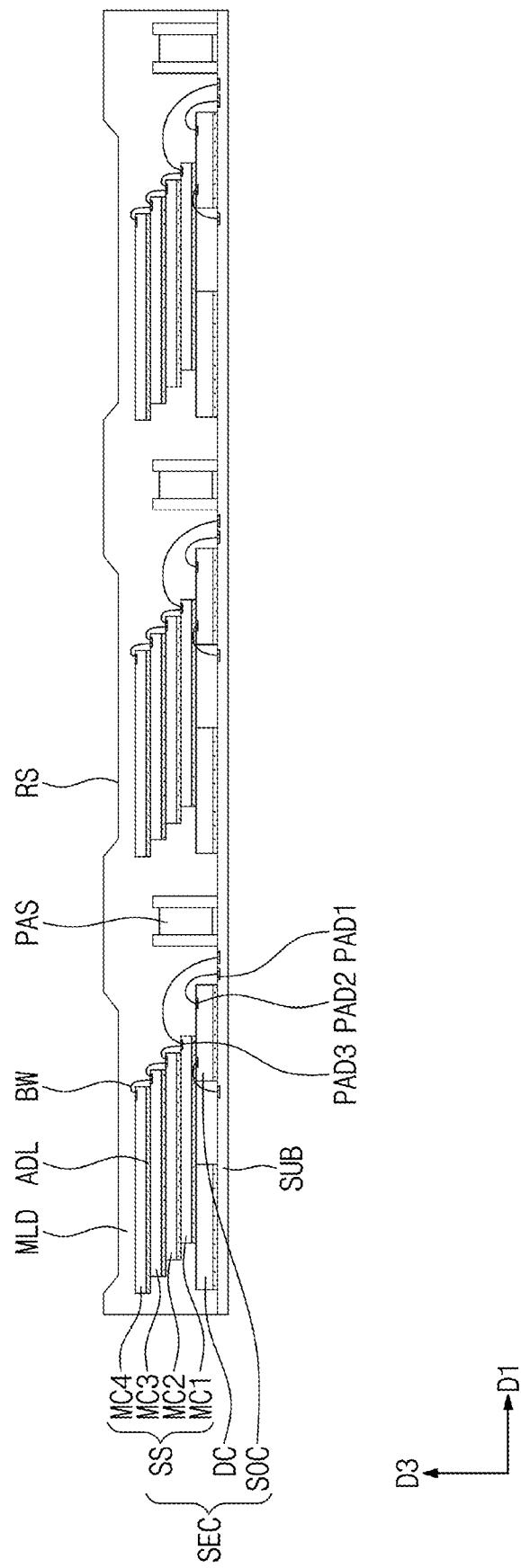

FIGS. 9A and 9B illustrate cross-sectional views showing stages in a method of fabricating a semiconductor package according to some embodiments.

Referring to FIG. 9A, a plurality of semiconductor chips SEC and a plurality of passive elements PAS may be mounted on the package substrate SUB. Each of the semiconductor chips SEC and each of the passive elements PAS may be respectively substantially the semiconductor chip SEC and the passive element PAS that are discussed with reference to FIG. 2.

A molding process may be performed to form the molding layer MLD that covers the semiconductor chip SEC and the passive element PAS. The molding layer MLD may include a dielectric polymer, e.g., an epoxy-based polymer. A planarization process may be performed on the molding layer MLD. Therefore, the molding layer MLD may have a flat profile on a top surface thereof.

Referring to FIG. 9B, a grinding process may be performed on the top surface of the molding layer MLD. The grinding process may form a plurality of recess regions RS on the top surface of the molding layer MLD. The recess regions RS may be formed on locations that correspond to, e.g., overlap, those of the semiconductor chips SEC. The recess region RS may be an area that is concave in a direction toward the package substrate SUB from the top surface of the molding layer MLD. Differently from that shown, the recess region RS may have an inner sidewall that is not inclined and extends vertically (see FIG. 3).

Referring back to FIG. 8C, a cutting process may be performed. For example, the molding layer MLD and the package substrate SUB may be diced along cutting lines CL illustrated in FIG. 8C. Therefore, it may be possible to fabricate a plurality of universal serial bus (USB) memory devices.

Referring again to FIG. 2, the connector CON and the connector terminal PIN may be formed below the package substrate SUB that is individually cut. The housing HOU may be formed to cover the molding layer MLD that is individually cut. The housing HOU may include the first part HOUa formed on the top surface of the molding layer MLD, the second part HOUb formed below the package substrate SUB, and the third part HOUc that connects the first and second parts HOUa and HOUc to each other. The air gap AG may be defined by the first part HOUa and the recess region RS.

By summation and review, embodiments provide a semiconductor package with a housing whose surface temperature is reduced. That is, according to example embodiments, a semiconductor chip may be provided thereon with an air gap defined by a housing and a recess region of a molding layer. Therefore, it may be possible to effectively hinder heat transfer from the semiconductor chip toward the housing. The housing may therefore have a reduced surface temperature. As such, it may be possible to avoid risk of burn on users and to improve product satisfaction.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a package substrate;
a semiconductor chip on the package substrate, the semiconductor chip including a logic chip and a memory stack structure on the logic chip;
a connector and a connector terminal below the package substrate;
a molding layer that covers the semiconductor chip, the molding layer having a recess region on a top surface of the molding layer;
a housing that covers the molding layer; and
an air gap on the semiconductor chip, the air gap being defined by the housing and the recess region of the molding layer, and the molding layer separating the air gap from the memory stack structure of the semiconductor chip,
wherein a portion of the molding layer is disposed between a top surface of the semiconductor chip and a bottom surface of the recess region.

2. The semiconductor package as claimed in claim 1, wherein a width of the air gap gradually increases in a direction perpendicular to a top surface of the package substrate.

3. The semiconductor package as claimed in claim 1, wherein the housing includes:
a first part on the top surface of the molding layer, the air gap being defined by the molding layer and the first part;
second part below the package substrate; and
a third part that connects the first part and the second part to each other.

4. The semiconductor package as claimed in claim 3, further comprising an opening defined by a bottom surface of the package substrate, the second part, and the third part.

5. The semiconductor package as claimed in claim 1, wherein the air gap vertically overlaps the semiconductor chip.

6. The semiconductor package as claimed in claim 1, wherein a portion of the air gap is offset from the semiconductor chip.

7. The semiconductor package as claimed in claim 1, wherein a width at the bottom surface of the recess region is in a range of about 1.2 mm to about 1.5 mm.

8. The semiconductor package as claimed in claim 1, wherein a thickness of the air gap is in a range of about 0.2 mm to about 0.6 mm.

9. The semiconductor package as claimed in claim 1, wherein a shortest distance between the memory stack structure and the bottom surface of the recess region is in a range of about 0.1 mm to about 1.2 mm.

10. The semiconductor package as claimed in claim 1, wherein the semiconductor chip further includes a dummy chip below the memory stack structure, the dummy chip being spaced apart from the logic chip.

11. A semiconductor package, comprising:
a package substrate;
a semiconductor chip on the package substrate, the semiconductor chip including a logic chip and a memory stack structure on the logic chip;
a connector below the package substrate;
a molding layer that covers the semiconductor chip, the molding layer having a recess region on a top surface of the molding layer;
a housing that covers the molding layer, the housing including a first part on the top surface of the molding layer, a second part below the package substrate, and a third part that connects the first part and the second part to each other; and
an air gap defined by the first part of the housing and the recess region of the molding layer, the air gap vertically overlapping the semiconductor chip,
wherein a portion of the molding layer is disposed between a top surface of the semiconductor chip and a bottom surface of the recess region.

12. The semiconductor package as claimed in claim 11, wherein a thickness of the air gap is in a range of about 0.2 mm to about 0.6 mm.

13. The semiconductor package as claimed in claim 11, wherein the molding layer separates the memory stack structure from the air gap.

14. The semiconductor package as claimed in claim 11, wherein the semiconductor chip further includes a dummy chip below the memory stack structure, the dummy chip being spaced apart from the logic chip.

15. The semiconductor package as claimed in claim 11, further comprising a passive element on the package substrate, the passive element being spaced apart from the semiconductor chip.

16. A semiconductor package, comprising:
a package substrate;
a semiconductor chip on the package substrate, the semiconductor chip including a logic chip and a memory stack structure on the logic chip;
a passive element on the package substrate and spaced apart from the semiconductor chip;
a connector and a connector terminal below the package substrate;
a molding layer that covers the semiconductor chip and the passive element, the molding layer having a recess region on a top surface of the molding layer;
a housing that covers the molding layer, the housing including a first part on the top surface of the molding layer, a second part below the package substrate, and a third part that connects the first part and the second part to each other;
an opening defined by a bottom surface of the package substrate, the second part, and the third part; and
an air gap defined by the first part of the housing and the recess region of the molding layer, the molding layer separating the memory stack structure from the air gap,
wherein a portion of the molding layer is disposed between a top surface of the semiconductor chip and a bottom surface of the recess region.

17. The semiconductor package as claimed in claim 16, wherein:
a thickness of the air gap is in a range of about 0.2 mm to about 0.6 mm, and a width at the bottom surface of the recess region is in a range of about 1.2 mm to about 1.5 mm.

18. The semiconductor package as claimed in claim 16, wherein the air gap vertically overlaps the semiconductor chip.

19. The semiconductor package as claimed in claim 16, wherein a width of the air gap gradually increases in a direction perpendicular to a top surface of the package substrate.

20. The semiconductor package as claimed in claim 16, wherein a shortest distance between the memory stack structure and the bottom surface of the recess region is in a range of about 0.1 mm to about 1.2 mm.

* * * * *